(12) United States Patent
Illing

(10) Patent No.: US 8,848,330 B2
(45) Date of Patent: Sep. 30, 2014

(54) CIRCUIT WITH A TEMPERATURE PROTECTED ELECTRONIC SWITCH

(75) Inventor: Robert Illing, Villach (AT)

(73) Assignee: Infineon Technologies Austria AG, Villach (AT)

( * ) Notice: Subject to any disclaimer, the term of this patent is extended or adjusted under 35 U.S.C. 154(b) by 369 days.

(21) Appl. No.: 13/194,604

(22) Filed: Jul. 29, 2011

(65) Prior Publication Data

US 2013/0027830 A1 Jan. 31, 2013

(51) Int. Cl.
*H02H 5/04* (2006.01)
*H02H 7/22* (2006.01)
*H03K 17/082* (2006.01)
*H03K 17/08* (2006.01)

(52) U.S. Cl.
CPC ....... *H02H 7/222* (2013.01); *H03K 2017/0806* (2013.01); *H03K 17/0822* (2013.01); *H02H 5/044* (2013.01)
USPC ........................................................ 361/103

(58) Field of Classification Search
CPC ........... G01K 3/00; G01K 3/005; G01K 3/08; G01K 3/14; G01K 1/026; G01K 7/01; H03K 2017/0806
USPC .......................................................... 361/103
See application file for complete search history.

(56) References Cited

U.S. PATENT DOCUMENTS

| | | | | |
|---|---|---|---|---|
| 6,144,085 | A * | 11/2000 | Barker | 257/467 |
| 6,628,491 | B1 * | 9/2003 | Tihanyi et al. | 361/93.8 |
| 7,734,440 | B2 * | 6/2010 | Hattis | 702/99 |
| 2004/0264093 | A1 * | 12/2004 | Boerstler et al. | 361/103 |
| 2010/0079197 | A1 | 4/2010 | Ladurner et al. | |
| 2012/0229193 | A1 | 9/2012 | Ladurner et al. | |

* cited by examiner

*Primary Examiner* — Jared Fureman
*Assistant Examiner* — Kevin J Comber
(74) *Attorney, Agent, or Firm* — Slater & Matsil, L.L.P.

(57) ABSTRACT

A method can be used for driving an electronic switch integrated in a semiconductor body. A first temperature is measured at a first position of the semiconductor body. A temperature propagation is detected in the semiconductor body. The electronic switch is switched off when the temperature at the first position rises above a first threshold that is set dependent on the detected temperature propagation.

19 Claims, 5 Drawing Sheets

CIRCUIT WITH A TEMPERATURE PROTECTED ELECTRONIC SWITCH

TECHNICAL FIELD

Embodiments of the present invention relate to an electronic circuit with a temperature protected electronic switch, and to a method for driving an electronic switch.

BACKGROUND

Electronic switches, such as MOSFETs, IGBTs, or other types of transistors are widely used as electronic switches for switching electrical loads, such as motors, lamps, magnetic valves, and the like. In these applications, the electronic switch is connected in series with the load, where the series circuit with the electronic switch and the load is connected between power supply terminals. The load can be switched on and off by switching the electronic switch on and off.

Usually, the on-resistance of the electronic switch, which is the resistance of the electronic switch in the on-state, is lower than the resistance of the load, so that in a normal operation state a voltage drop across the electronic switch is significantly lower than a voltage drop across the load, when the electronic switch is switched on. When, however, there is a short circuit in the load and when the electronic switch is in the on-state, the voltage drop across the electronic switch increases and the electric power dissipated in the electronic switch increases. The increase in dissipated power results in an increased temperature of the electronic switch.

According to a first approach for protecting the electronic switch from being damaged, the temperature in the electronic switch may be detected and the electronic switch may be switched off when the temperature reaches a given temperature threshold.

According to a second approach, a first temperature in the electronic switch and a second temperature remote to the electronic switch may be measured and the electronic switch may be switched off when the difference between these two temperatures reaches a given temperature difference threshold. Both, the first and the second approach can be applied together.

There is a need for an improved temperature protection of an electronic switch.

SUMMARY OF THE INVENTION

According to a first aspect, an electronic circuit is disclosed. The electronic circuit includes an electronic switch integrated in a semiconductor body and having a control terminal. The electronic switch further includes a drive circuit coupled to the control terminal and including a thermal protection circuit. The thermal protection circuit includes a first temperature sensor having a first sensor element located at a first position on the semiconductor body, where the first temperature sensor is configured to provide a first temperature signal that is representative of a temperature at the first position. The thermal protection circuit further includes a temperature propagation detection circuit that is configured to detect a temperature propagation in the semiconductor body and that is configured to provide a temperature propagation signal, wherein the thermal protection circuit is configured to switch the electronic switch off, when the temperature at the first position rises above a first threshold, and wherein the first threshold is dependent on the temperature propagation signal.

According to a second aspect, a method for driving an electronic switch integrated in a semiconductor body is disclosed. The method includes measuring a first temperature at a first position of the semiconductor body, detecting a temperature propagation in the semiconductor body, and switching off the electronic switch, when the temperature at the first position rises above a first threshold. The first threshold is set dependent on the detected temperature propagation.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

Figure 1:
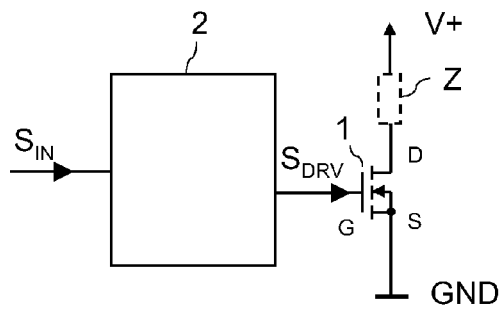
FIG. 1 illustrates an electronic circuit with an electronic switch and a drive circuit.

FIG. 1 illustrates an electronic circuit with an electronic switch 1 and a drive circuit 2 that is configured to drive the electronic switch 1. The electronic switch 1 has a load path and a control terminal, where the control terminal is connected to an output of the drive circuit 2 and receives a drive signal $S_{DRV}$ from the drive circuit 2. In the electronic circuit illustrated in FIG. 1, the electronic switch 1 is implemented as a MOSFET, specifically as an n-type MOSFET. The MOSFET has drain and source terminals and a gate terminal. The gate terminal is a control terminal of the MOSFET, and a load path of the MOSFET extends between the drain and the source terminals. It should be noted that implementing the electronic switch 1 as an n-type MOSFET is only an example. The electronic switch 1 could also be implemented as another type of a MOSFET, such as a p-type MOSFET, or as another type of transistor, such as an IGBT, a JFET, or as a BJT.

The electronic switch 1 can be employed as a switch for switching an electrical load Z, such as a motor, a lamp an actor, and the like. For illustration purposes, the load Z is also illustrated (in dashed lines) in FIG. 1. The load Z is connected in series with the load path of the electronic switch 1, where the series circuit with the electronic switch 1 and the load Z is connected between supply terminals for a positive supply potential V+ and a negative supply potential or reference potential GND. In the embodiment illustrated in FIG. 1, the electronic switch 1 is connected in a low-side configuration, which means that the electronic switch 1 is connected between the load Z and the terminal for the reference potential GND. However, this is only an example. The electronic switch 1, could also be connected in a high-side configuration.

The drive circuit 2 is configured to switch the electronic switch 1 on and off dependent on an input signal $S_{IN}$, where the load Z is switched on when the electronic switch 1 is in an on-state (switched on), and where the load Z is switched off, when the electronic switch 1 is in an off-state (switched off). When the electronic switch 1 is switched on and when the load Z is in a normal (faultless) operation a supply voltage that is available between the supply terminals mainly drops across the load Z. When, however, the electronic switch 1 is in the on-state and there is a short circuit in the load Z, the supply voltage mainly drops across the load path of the electronic switch 1. In this case a significant amount of electrical power is dissipated in the electronic switch 1, which causes a temperature of the electronic switch 1 to increase.

The drive circuit 2 includes a thermal protection circuit, that will be explained in further detail herein below. This thermal protection circuit is configured to protect the electronic switch 1 from being overheated. A first embodiment of a temperature protection method employed by the thermal protection circuit will be explained with reference to FIGS. 2 and 3.

Figure 2:
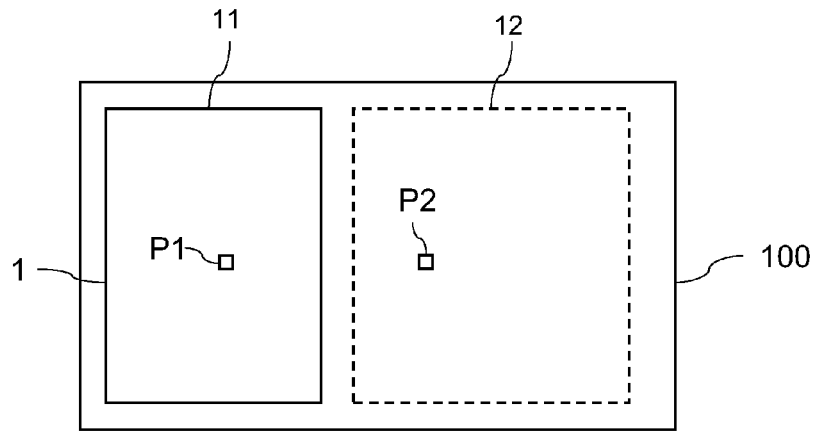
FIG. 2 schematically illustrates a top view on a semiconductor body in which the electronic switch is implemented, and illustrates first and second positions for temperature measurement.

FIG. 2 schematically illustrates a top view of a semiconductor body (semiconductor chip, semiconductor die) 100 in which the electronic switch 1 is integrated. The semiconductor body 100 includes a first active region 11 in which active regions, such as body, source and drain regions, of the electronic switch 1 are integrated. The semiconductor body 100 further includes an outside region 12, which is a region of the semiconductor body 100 next to the active region 11. The outside region 12 may include a logic circuit, such as the drive circuit 2 or parts of the drive circuit 2. P1, P2 in FIG. 2 denote first and second positions on the semiconductor body 100. The first position P1 is arranged within the active region 11, and the second position P2 is arranged in the outside region 12 and remote to the active region 11.

Figure 3:
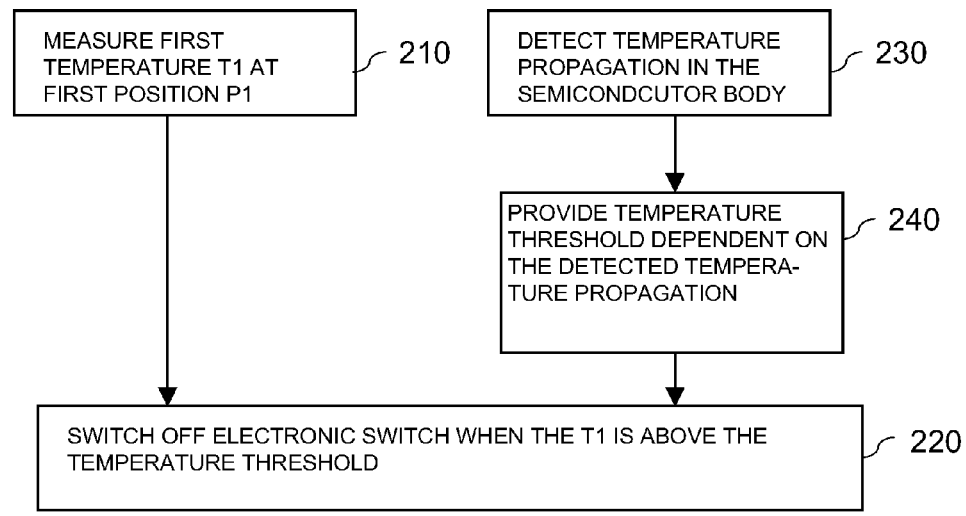
FIG. 3 shows method steps of a temperature protection method according to a first embodiment that includes detecting a temperature propagation in the semiconductor body.

Referring to FIG. 3, the temperature protection method includes measuring a first temperature T1 at the first position P1 (method step 210), and switching off the electronic switch 1 when the first temperature T1 is above a temperature threshold (method step 220). The method further includes detecting a temperature propagation in the semiconductor body 100 (method step 230), specifically in the outside region 12 of the semiconductor body 100, and providing the temperature threshold dependent on the detected temperature propagation (method step 240).

Figure 4:
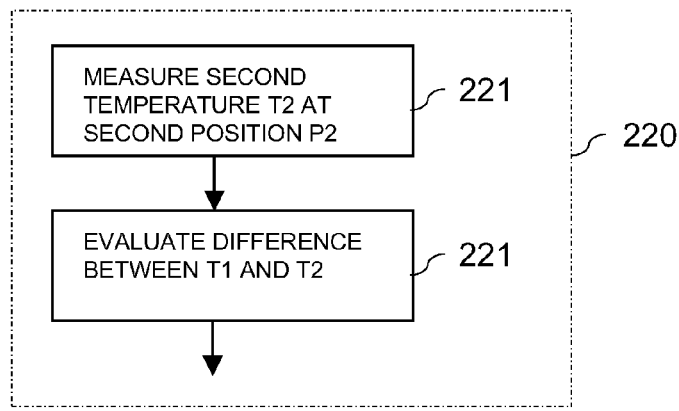
FIG. 4 illustrates method steps for detecting the temperature propagation.

Referring to FIG. 4, the method step 230 of detecting the temperature propagation in the semiconductor body 100 may include measuring a second temperature T2 at the second position P2 (method step 221), and evaluating a temperature difference between the first temperature T1 and the second temperature T2. The temperature difference between the first and second positions P1, P2 is a measure for the temperature propagation in the semiconductor body 100. When, for example, a short circuit occurs in the load Z (see FIG. 1), the temperature at the first position P1, that is within the active area 11 of the electronic switch 1, will rapidly increase. A delay time between the occurrence of the short circuit and the increase of the temperature at the first position P1 is, for example, in the range of several microseconds (µs), such as between 5 µs and 15 µs. The semiconductor body 100 has a thermal impedance that influences a heat or temperature propagation from the active region 11, where the energy is dissipated, into the outside region 12. Since the second position P2 is arranged distant to the active region 11, a delay time between the occurrence of the short-circuit in the load and the time when the temperature at the second position P2 starts to increase, is higher than at the first position P1. Thus, at the time of the occurrence of the short-circuit there is a high temperature difference between the first and the second temperatures T1, T2. This temperature difference of the first and second temperature T1, T2 is a measure for the temperature propagation in the semiconductor body 100. According to one embodiment, the temperature threshold is dependent on a first temperature difference dT1 between the first and second temperatures T1, T2. The dependency of the temperature threshold from the temperature difference dT1 is, for example, such that there is at least one temperature difference range of this temperature difference dT1 in which the temperature threshold decreases with increasing temperature difference dT1.

Figure 5:
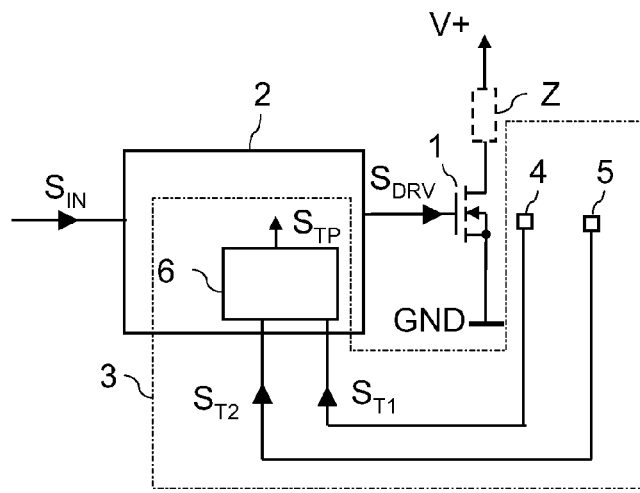
FIG. 5 illustrates an embodiment of a drive circuit that includes a thermal protection circuit.

FIG. 5 illustrates a first embodiment of the drive circuit 2. The drive circuit 2 according to FIG. 5 receives the input signal $S_{IN}$, provides the drive signal $S_{DRV}$ and includes a thermal protection circuit 3. The thermal protection circuit 3 is configured to provide a thermal protection signal $S_{TP}$, where the drive circuit 2 is configured to generate the drive signal $S_{DRV}$ dependent on the input signal $S_{IN}$ and dependent on the thermal protection signal $S_{TP}$. The drive circuit 2 switches the electronic switch 1 off when the thermal protection circuit $S_{TP}$ indicates that the first temperature T1 at the first position P1 has reached the first temperature threshold. This will be explained in further detail below.

Referring to FIG. 5, the thermal protection circuit 3 includes a first temperature sensor 4 and a second temperature sensor 5. The first temperature sensor 4 is arranged at the first position P1 and is configured to provide a first temperature signal $S_{T1}$ that is representative of the first temperature T1. The second temperature sensor 5 is arranged at the second position P2 and is configured to provide a second temperature signal $S_{T2}$ that is representative of the second temperature T2 at the second position P2. An evaluation circuit 6 receives the first and second temperature signals $S_{T1}$, $S_{T2}$ and generates the thermal protection signal $S_{TP}$.

Figure 6:
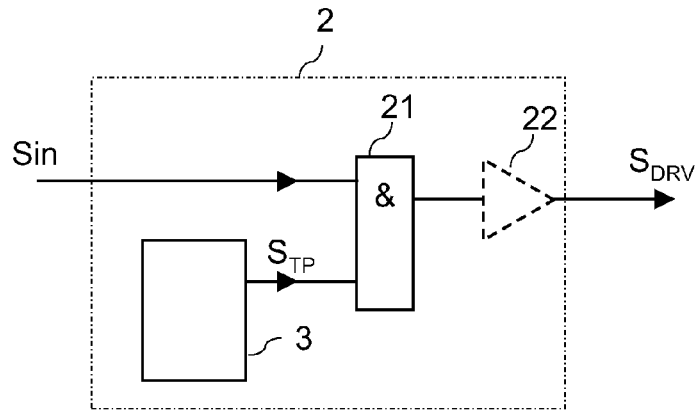
FIG. 6 illustrates a first embodiment of driving the electronic switch dependent on an input signal of the drive circuit and dependent on a thermal protection signal.

FIG. 6 illustrates a first embodiment of generating the drive signal $S_{DRV}$ and driving the electronic switch 1 dependent on the input signal $S_{IN}$ and the thermal protection signal $S_{TP}$. In this embodiment, the drive circuit 2 includes a logic gate 21, such as an AND gate, that receives the input signal $S_{IN}$ and the thermal protection signal $S_{TP}$. The drive signal $S_{DRV}$ is available at an output of the logic gate 21, wherein optionally a driver 22 is connected downstream the logic gate 21. The driver 22 is configured to amplify a logic signal available at the output of the logic gate 21 to a signal level that is suitable for driving the electronic switch 1.

The drive signal $S_{DRV}$ assumes one of an on-level and an off-level, where the electronic switch 1 is switched on when the drive signal $S_{DRV}$ assumes an on-level, and where the electronic switch 1 is switched off when the drive signal $S_{DRV}$ assumes an off-level. Equivalently, the input signal $S_{IN}$ may assume an on-level indicating that the electronic switch 1 is to be switched on and an off-level indicating that the electronic switch is to be switched off. The thermal protection signal $S_{TP}$ may assume a normal level and a protection level, where the electronic switch 1 is to be switched off when the thermal protection signal $S_{TP}$ assumes the protection level, while the thermal protection signal $S_{TP}$ does not influence switching of the electronic switch 1 when it assumes the normal level. For explanation purposes it is assumed that the on-level of the input signal $S_{IN}$ is a high level (logic "1"), that the off-level of the input signal $S_{IN}$ is a low level (logic "0"), that the protection level of the thermal protection signal $S_{TP}$ is a low level (logic "0"), and that the normal level of the thermal protection signal $S_{TP}$ is a high level (Logic "1"). In this case, the AND gate 21 generates a low level at its output in order to switch the electronic switch 1 off, each time the input signal $S_{IN}$ assumes an off-level, and each time the thermal protection signal $S_{TP}$ assumes the protection level. It goes without saying that the on-level and off-level of the input signal $S_{IN}$ and the protection level and the normal level of the thermal protection signal $S_{TP}$ could also be represented by other signal levels than explained before. In this case, the logic gate 21 has to be adapted to the signal levels of these signals $S_{IN}$, $S_{TP}$.

Figure 7:
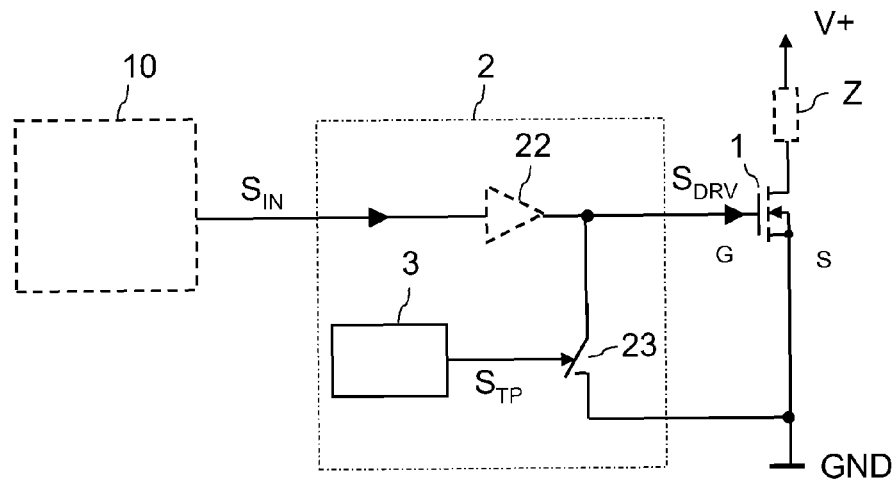
FIG. 7 illustrates a second embodiment of driving the electronic switch dependent on an input signal of the drive circuit and dependent on a thermal protection signal.

FIG. 7 illustrates a further embodiment of generating the drive signal $S_{DRV}$ and driving the electronic switch 1 dependent on the input signal $S_{IN}$ and the thermal protection signal $S_{TP}$. In this embodiment, an electronic switch 23, such as a transistor, is connected between the control terminal and one of the load terminals of the electronic switch 1. In the embodiment illustrated in FIG. 7 in which the electronic switch 1 is implemented as a MOSFET, the switch 23 is connected between the gate terminal G and the source terminal S. the switch 23 is controlled by the thermal protection signal $S_{TP}$, wherein the switch 23 is switched on, in order to switch off the electronic switch 1, each time the thermal protection signal $S_{TP}$ assumes the protection level. In this embodiment, the protection level $S_{TP}$ is, for example, a high level that is suitable to switch the switch 23 on.

Figure 8:
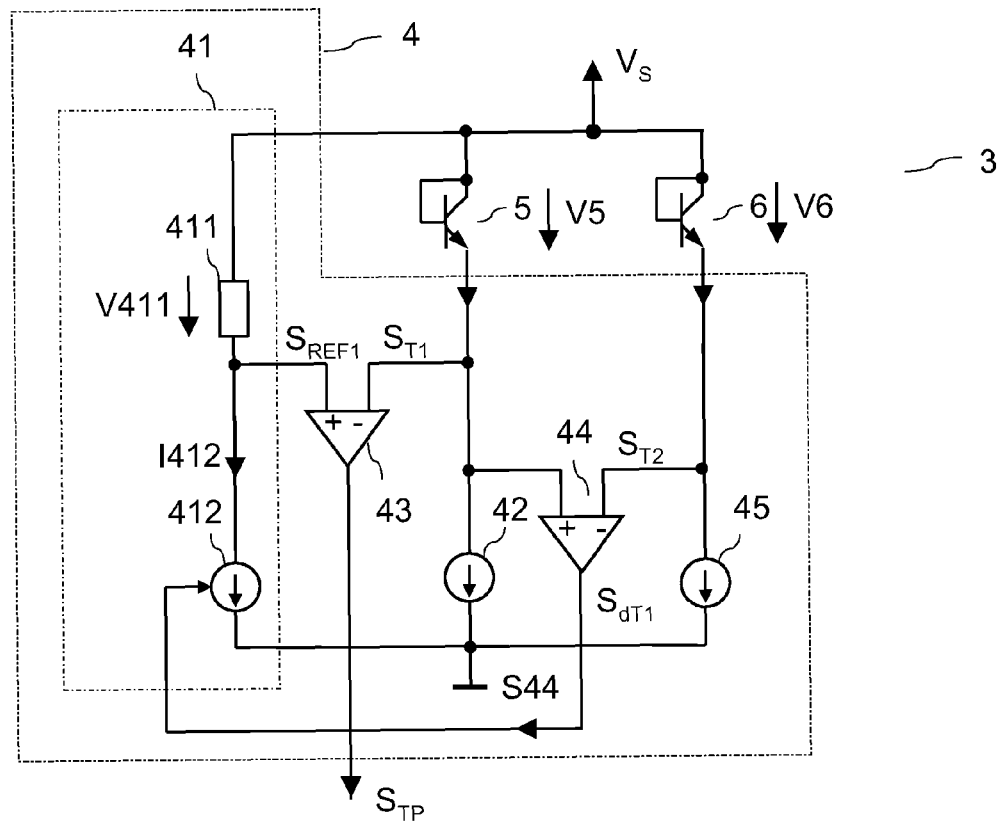
FIG. 8 illustrates a first embodiment of the thermal protection circuit.

FIG. 8 shows a circuit diagram of a thermal protection circuit 3 according to a first embodiment. In this thermal protection circuit 3 the first and second temperature sensors 5, 6 are implemented as diodes that are forward biased. In particular, the temperature sensors 5, 6 are implemented as bipolar transistors connected as diodes, which means that a base terminal of each transistor is connected to its collector terminal.

Referring to FIG. 8, the evaluation circuit 4 includes a reference signal generator 41 generating a reference signal $S_{REF1}$ that is representative of the temperature threshold. This reference signal generator 41 includes a series circuit with a resistor 411 and a variable first current source 412 connected in series with the resistor 411. The series circuit with the resistor 411 and the first current source 412 is connected between voltage supply terminals between which a supply voltage $V_S$ is available. The reference signal $S_{REF1}$ is an electrical potential at a circuit node between the resistor 411 and the first current source 412. This electrical potential equals the supply voltage or supply potential $V_S$ minus a voltage drop V411 across the resistor 411 induced by a current provided by the first current source 412. For explanation purposes it is assumed that the resistor 411 has a resistance that is widely independent of the temperature. In this case, the reference signal $S_{REF1}$ decreases when the current I412 provided by the first current source 412 increases.

The evaluation circuit 4 further includes a current source 42 connected in series with the temperature sensor 5. This current source 42 draws a current through the sensor 5, where this current causes a voltage drop V5 across the sensor 5. The voltage across a diode that is forward biased, such as in the temperature sensor 5 of FIG. 8, has a negative temperature coefficient, which means that the voltage V5 decreases when the temperature increases. The first temperature signal $S_{T1}$ is a voltage at a circuit node between the first temperature sensor 5 and the second current source 42. This temperature signal $S_{T1}$ equals the supply voltage $V_S$ minus the voltage drop V5 across the temperature sensor 5, so that the first temperature signal $S_{T1}$ increases when the temperature increases.

Referring to FIG. 8 the thermal protection signal $S_{TP}$ is available at an output of a comparator 43 that receives the first temperature signal $S_{T1}$ at a first input and the reference signal $S_{REF1}$ at a second input. In the embodiment illustrated in FIG. 8, the first input of the comparator 43 is an inverting input, while the second input is a non-inverting input. In this embodiment, the protection signal level of the thermal protection signal $S_{TP}$, which is the signal level the thermal protection signal $S_{TP}$ assumes when the first temperature T1 reaches the temperature threshold or when the first thermal protection signal $S_{T1}$ reaches the reference signal $S_{REF1}$, is a low-level. In case it is desired to have a high-level of the thermal protection signal $S_{TP}$ as a protection level, the inputs of the comparator 43 have to be changed.

Referring to FIG. 8, the thermal protection circuit 3 further includes the second temperature 6 arranged at the second position P2 of the semiconductor body 100 (see FIG. 2). Like the first temperature sensor 5, the second temperature sensor 6 is implemented as a bipolar diode connected as a diode. A third current source 45 is connected in series with the second temperature sensor 6, where the series circuit with the second temperature sensor 6 and the third current source 45 is connected between the supply terminals. The operating principle of the second temperature sensor 6 is the same as the operating principle of the first temperature sensor explained before. The second temperature signal $S_{T2}$ is available at a circuit node between the second temperature sensor 6 and the current source 45. Like the first temperature signal $S_{T1}$ the second temperature signal $S_{T2}$ is an electrical potential, where the second temperature signal $S_{T2}$ increases when the temperature at the second temperature sensor 6 increases.

In order to adjust the reference signal $S_{REF1}$ dependent on a temperature difference between the temperatures at the first and second temperature sensors 5, 6, the thermal protection circuit 3 includes an amplifier 44 that receives the first temperature signal $S_{T1}$ at a non-inverting input, the second temperature signal $S_{T2}$ at an inverting input and that generates an output signal S44 which controls the current I412 provided by the first current source 412. The output signal S44 of this amplifier 44 is dependent on a difference between the first and second temperature signals $S_{T1}$, $S_{T2}$. According to one embodiment, the controllable current source 412 is configured to increase the current I412, in order to decrease the reference signal $S_{REF1}$, when the output signal S44 of the amplifier, that represents the difference between the first and second temperature signals $S_{T1}$, $S_{T2}$, increases.

According to one embodiment, the current source 412 is configured to continuously change the current I412 when the amplifier output signal S44 changes. According to a further embodiment, the current source is a discrete current source that provides one of two (or more) output currents I412 dependent on the amplifier output signal S44, where the current source 412 may provide a first current when the amplifier signal S44 representing the temperature difference is below a given threshold and a may provide a second current when the amplifier signal S44 is above the threshold.

Figure 9:
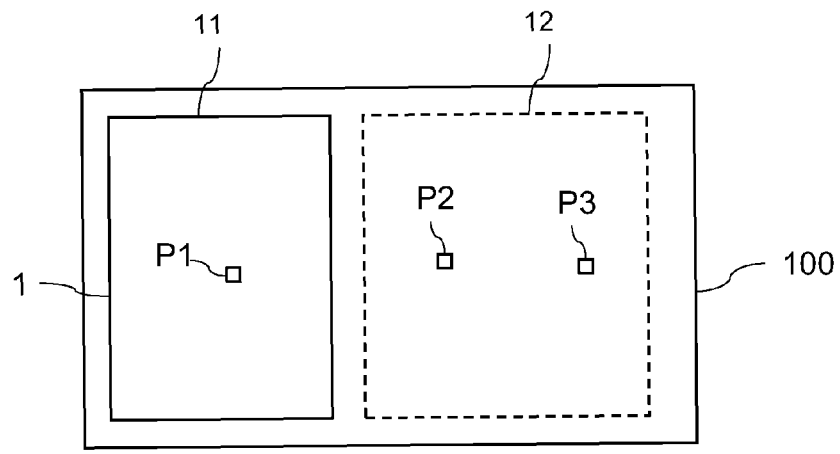
FIG. 9 schematically illustrates a top view on a semiconductor body in which the electronic switch is implemented, and illustrates first, second and third positions for temperature measurement.

FIG. 9 illustrates a top view on a semiconductor body 100 according to a further embodiment. In this embodiment, temperatures at three different positions P1, P2, P3 of the semiconductor body 100 are measured. The second and the third positions P2, P3 are positions in the outside region 12, while the first position P1 is within the active region 11 in which the electronic switch 1 is implemented. The third position P3 is arranged more distant to the active region 11 than the second position P2. According to one embodiment, the second and third positions P2, P3 are selected such that upon occurrence of a short-circuit in the electronic switch 1 the temperature at the second position P2 rises after about 5 ms to 15 ms, while the temperature at the third position P3 rises after between about 40 ms and 60 ms after the occurrence of the short circuit.

A first method for protecting the electronic switch 1 using the temperatures T1, T2, T3 obtained at the three positions P1, P2, P3 includes: comparing the first temperature P1 with a first temperature threshold; switching off the electronic switch 1 when the first temperature T1 reaches or increases above the first temperature threshold; detecting a temperature propagation in the semiconductor body 100 based on a temperature difference between temperatures at the second position P2 and the third position P3; and adjusting the temperature threshold dependent on the detected temperature propagation.

A second method for protecting the electronic switch 1 using the temperatures T1, T2, T3 obtained at the three positions P1, P2, P3 includes: comparing the first temperature P1 with a first temperature threshold; comparing a temperature difference T1−T3 between the first and third temperature T1, T3 with a temperature difference threshold; switching off the electronic switch 1 when the first temperature T1 reaches or increases above the first temperature threshold and/or when the temperature difference T1−T3 reaches or increases above the temperature difference threshold; detecting a temperature propagation in the semiconductor body 100 based on a temperature difference between temperatures at the second position P2 and the third position P3; and adjusting at least one of the temperature threshold and the temperature difference threshold dependent on the detected temperature propagation.

The temperature difference between temperatures T2, T3 at the second and third positions will be referred to as second temperature threshold in the following. This second temperature difference is a measure for the temperature propagation in the semiconductor body 100. According to one embodiment, at least one of the temperature threshold and the temperature difference threshold is dependent on this second temperature difference T2−T3. According to a further embodiment, the temperature difference T1−T3 between the first temperature T1 and the third temperature T3 is used as a measure for the temperature propagation. In this case, at least one of the temperature threshold and the temperature difference threshold is dependent on the temperature difference T1−T3.

Figure 10:
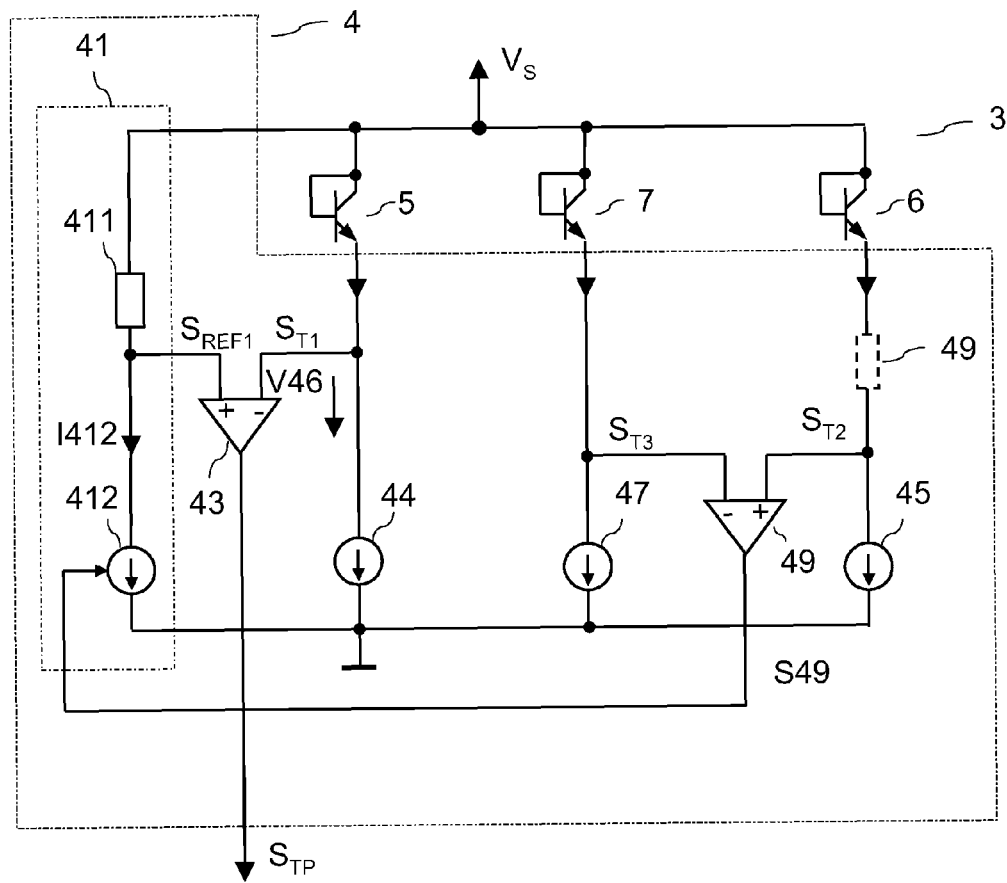
FIG. 10 illustrates a second embodiment of the thermal protection circuit.

FIG. 10 illustrates an embodiment of a thermal protection circuit 3 that is configured to generate the thermal protection signal $S_{TP}$ dependent on the first, the second and the third temperature T1, T2, T3. The thermal protection circuit 3 of FIG. 10 is based on the thermal protection circuit of FIG. 8, where the thermal protection circuit of FIG. 10 additionally includes a third temperature sensor 7. This temperature sensor 7 is located at the third position P3 in the semiconductor body 100 and, like the first and second temperature sensors 5, 6, is implemented as a bipolar transistor connected as a diode. A fourth current source 47 is connected in series with the third temperature sensor 7, where the series circuit with the third temperature sensor 7 and the fourth current source 47 is connected between the voltage supply terminals. A third temperature signal $S_{T3}$ is available at a circuit node between the third temperature sensor 7 and the fourth current source 47.

Like in the thermal protection circuit of FIG. 8, the thermal protection signal $S_{TP}$ is available at the output of the comparator 43 that receives the reference signal $S_{REF1}$ from the reference signal generator 41 and the first temperature signal $S_{T1}$. This comparator 43 will be referred to as first comparator in the following.

Referring to FIG. 10, an amplifier 49 calculates the difference between the second temperature signal $S_{T2}$ and the third temperature signal $S_{T3}$ and provides an output signal S49 that is dependent on this difference. The amplifier output signal S49 is received by the first current source 412 in order to adjust the current provided by this current source 412 dependent on this temperature difference and in order to adjust the temperature threshold represented by the reference signal $S_{REF1}$. The first current source 412 is implemented such that the current I412 provided by this current source 412 increases when the amplifier output signal S49 increases, so as to reduce the temperature threshold $S_{REF1}$. In the embodiment illustrated in FIG. 10, the amplifier output signal S49 increases when the difference between the second temperature signal $S_{T2}$ of the third temperature signal $S_{T3}$ increases. The second temperature signal $S_{T2}$, like in the embodiment of FIG. 8, is available at a circuit node between the second temperature sensor 6 and the third current source 45. Optionally, a resistor 49 is connected between the second temperature sensor 6 and the third current source 45, wherein in this case the second temperature signal $S_{T2}$ is available between the further resistor 49 and the third current source 45. This resistor 49 serves to generate an offset of the second temperature signal.

The operating principle of the temperature protection circuit is now explained. For explanation purposes it is assumed that there is a short circuit in the load Z (see FIG. 7) which causes a load current through the transistor 1 to increase and, therefore, the temperature in the semiconductor body 100 to increase. It is further assumed that the first comparator 43 is a hysteresis comparator that causes the transistor 1 to be switched off when the first temperature T1 reaches the temperature threshold and that causes the transistor 1 to be switched on again when the first temperature T1 falls to a temperature that corresponds to the temperature threshold minus a hysteresis value (and when the input signal $S_{IN}$ still has an on-level). For explanation purposes it is further assumed that a short circuit occurs in the load Z (see FIG. 7) and that the input signal $S_{IN}$ has an on-level during the period of the short circuit.

Right after the occurrence of the short circuit, the temperature at the first position P1 increases, while there is no significant temperature increase at the second and third position P2, P3. Thus, the temperature threshold represented by the reference signal $S_{REF1}$ has a start value. When the first temperature T1 reaches the temperature threshold the transistor 1 is switched off. During the off-period, the first temperature T1 may decrease and the heat at the first position may propagate in the semiconductor body 100 in the direction of the second and third positions P2, P3. When the first temperature T1 falls to below the temperature threshold minus the hysteresis, the transistor 1 is again switched on. After several cycles of switching off and on the transistor 1, the temperature at the second position P2 may increase due to the heat propagation in the semiconductor body 100, while the temperature at the third position P3 which is arranged even more distant to the first position P1 is not yet influenced by the heat propagation in the semiconductor body 100. When the second temperature T2 increases and the third temperature T3 may not change, the temperature difference between the second and third temperatures T2, T3 increases, which causes the temperature threshold to be decreased. Decreasing the temperature threshold has the effect that the transistor 1 is switched off at lower temperatures, which reduces a temperature induced stress of the semiconductor body 100 and, therefore, increases the robustness of the transistor.

Reducing the temperature threshold requires a heat propagation from the first position P1, where the heat is dissipated, to the second position P2, so that there is a reduction of the temperature threshold only when the short circuit exists long enough for the temperature to propagate from the first position P1 to the second position P2.

Figure 11:
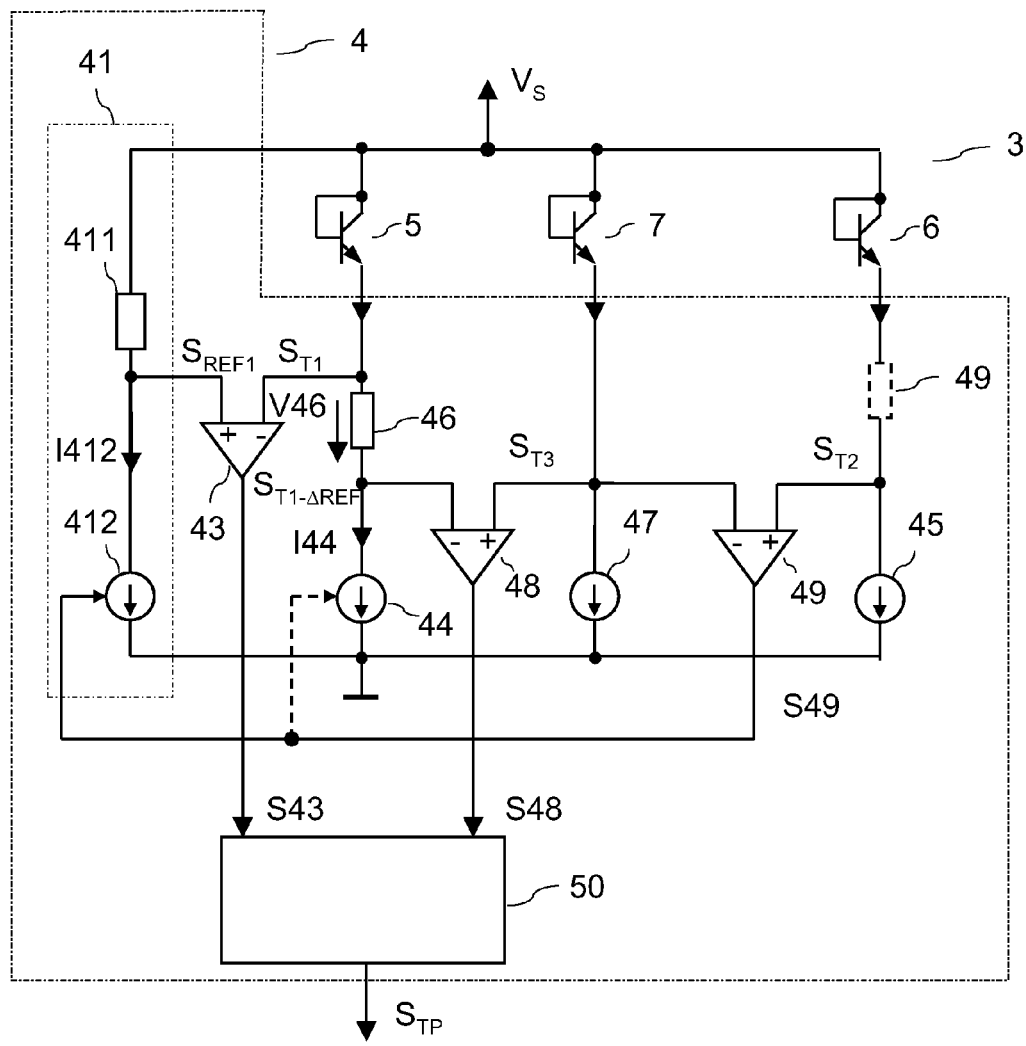
FIG. 11 illustrates a further embodiment of the thermal protection circuit.

Optionally, a controller 10 (illustrated in dashed lines in FIG. 7) monitors the temperature dependent switching off and on of the transistor 1 and switches the transistor 1 off, by setting the input signal $S_{IN}$ to an off-level, when a given number of switching cycles has been reached or when the temperature induced switching off and on exists for longer than a given time period, such as, for example between 200 ms and 300 ms, FIG. 11 illustrates a further embodiment of a temperature protection circuit. The circuit according to FIG. 11 is based on the circuit according to FIG. 10 and further includes a second comparator 48 that receives the third temperature signal $S_{T3}$ at a non-inverting input and a signal $S_{T1-\Delta REF}$ representing the first temperature signal $S_{T1}$ minus a temperature difference threshold signal at an inverting input. This temperature difference threshold signal is represented by a voltage V46 across a resistor 46 connected between the first temperature sensor 5 and the second current source 44. The first temperature signal $S_{T1}$ is available at a circuit node between the first temperature sensor 5 and the resistor 46, while signal $S_{T1-\Delta REF}$ is available at a circuit node between the resistor 46 and the second current source 44.

An output signal S48 of the second comparator 48 may assume one of two different signal levels, namely a first signal level when the signal $S_{T1-\Delta REF}$ is below the third temperature signal $S_{T3}$, and a second signal level when the signal $S_{T1-\Delta REF}$ is above the third temperature signal $S_{T3}$. In the first case, a difference $S_{T1}-S_{T3}$ between the first and third temperature signals $S_{T1}$, $S_{T3}$ is below the difference threshold signal represented by the voltage V46, and in the second case the difference $S_{T1}-S_{T3}$ between the first and third temperature signals $S_{T1}$, $S_{T3}$ is above the temperature difference threshold signal. In the first case, a temperature difference T1–T3 between the first and third temperatures T1, T3 is below the threshold defined by the voltage V46, while in the second case this temperature difference T1–T3 is above the temperature difference threshold.

In the embodiment of FIG. 11 first signal level of the output signal S48 of the second comparator 48 is a low level (logic "0"), while the second signal level is a high level (logic "1"). An output signal S43 of the first comparator 43 and the output signal S48 of the second comparator 48 are received by a logic circuit 50 that generates the thermal protection signal $S_{TP}$ dependent on these comparator signals S43, S48. According to one embodiment, the logic circuit 50 is implemented such that the temperature protection signal $S_{TP}$ switches the electronic switch 1 off when at least one of the following conditions are met: The first temperature T1 is above the temperature threshold; the temperature difference T1–T3 between the first and third temperatures T1, T3 is above the temperature difference threshold. According to a further embodiment, the logic circuit 5 includes or is implemented as an AND gate. In this case, the electronic switch 1 is switched off through the thermal protection signal $S_{TP}$ only when both of the two conditions explained before are met.

In the circuit of FIG. 11, the current source 412 defines the temperature threshold and the current source 44 defines the temperature difference threshold. At least one of these current sources 412, 44 receives the amplifier signal S49, so as to adjust at least one of the temperature threshold and the difference temperature threshold dependent on the temperature propagation in the semiconductor body, where the temperature difference between the second and third temperatures T2, T3 is a measure for the temperature propagation.

The current source 412 of the reference signal generator 41 is, for example, implemented such that the current I412 provided by this current source 412 increases when the amplifier signal S49 increase, so as to decrease the threshold $S_{REF1}$. The current source 44 is, for example, implemented such that the current I44 provided by this current source 44 decreases when the amplifier output signal S49 increase. When the current I44 decreases, the voltage drop V46 across the resistor 46 decreases, so that the difference temperature threshold (that is represented by the voltage drop V46) decreases. The current sources 412, 44 can be implemented like conventional controllable current sources.

It should be noted that although the embodiments discloses before include analog devices, such as current sources, embodiments of the invention are not restricted to be implemented using analog devices. Instead, embodiments of the invention can be implemented using digital devices or using a mixed technology with analog and digital devices as well.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit, comprising:
an electronic switch integrated in a semiconductor body and having a control terminal; and
a drive circuit coupled to the control terminal and comprising a temperature protection circuit, the temperature protection circuit comprising:
a first temperature sensor having a first sensor element located at a first position on the semiconductor body, the first temperature sensor configured to provide a first temperature signal that is representative of a temperature at the first position; and
a temperature propagation detection circuit that is configured to continuously detect a temperature difference between two regions in the semiconductor body and that is configured to provide a temperature propagation signal based on the temperature difference;
wherein
the temperature protection circuit is configured to switch the electronic switch off, when the temperature at the first position rises above a first threshold;
the first threshold is dependent on the temperature propagation signal based on the temperature difference;
the temperature propagation detection circuit further comprises a second temperature sensor, the second temperature sensor having a second sensor element located at a second position remote to the first position and the second temperature sensor configured to provide a second temperature signal that is representative of a temperature at the second position;
the temperature propagation detection circuit is configured to generate the temperature propagation signal dependent on a difference between the first temperature signal and the second temperature signal; and
the temperature protection circuit is configured to decrease the first threshold when the difference between the first temperature signal and the second temperature signal increases and/or when the difference between the first temperature signal and the second temperature signal rises above a temperature difference threshold.

2. The electronic circuit of claim 1, wherein the temperature propagation detection circuit is configured to generate the temperature propagation signal dependent on a difference between the first temperature signal and the second temperature signal.

3. The electronic circuit of claim 1,
wherein the semiconductor body comprises a first active area in which the electronic switch is integrated,
wherein the first temperature sensor is arranged within the first active area, and
wherein the second temperature sensor is arranged outside the first active area.

4. The electronic circuit of claim 1,
wherein the temperature protection circuit further comprises a third temperature sensor having a third sensor element located at a third position remote to the first position and the second position, the third temperature sensor configured to provide a third temperature signal that is representative of a temperature at the third position, and wherein the temperature protection circuit is further configured to switch the electronic switch off, when a temperature difference between a temperature at the first position and a temperature at the third position rises above a second temperature threshold.

5. The electronic circuit of claim 4,
wherein the semiconductor body comprises a first active area in which the electronic switch is integrated,
wherein the first temperature sensor is arranged within the first active area, and
wherein the second temperature sensor is arranged outside the first active area,
and wherein the third temperature sensor is arranged outside the first active area and arranged more distant to the first active area than the second temperature sensor.

6. The electronic circuit of claim 4, wherein the second temperature threshold is dependent on the temperature propagation signal.

7. The electronic circuit of claim 4, wherein the temperature propagation detection circuit is configured to generate the temperature propagation signal dependent on a difference between the second temperature signal and the third temperature signal.

8. The electronic circuit of claim 1, wherein the electronic switch comprises a MOSFET.

9. The electronic circuit of claim 1, wherein then first sensor element is implemented as a diode, a resistor, or a bipolar transistor.

10. An electronic circuit, comprising:
an electronic switch integrated in a semiconductor body and having a control terminal; and
a drive circuit coupled to the control terminal and comprising a temperature protection circuit, the temperature protection circuit comprising:
a first temperature sensor having a first sensor element located at a first position on the semiconductor body, the first temperature sensor configured to provide a first temperature signal that is representative of a temperature at the first position; and
a temperature propagation detection circuit that is configured to continuously detect a temperature difference between two regions in the semiconductor body and that is configured to provide a temperature propagation signal based on the temperature difference;
wherein
the temperature protection circuit is configured to switch the electronic switch off, when the temperature at the first position rises above a first threshold;
the first threshold is dependent on the temperature propagation signal based on the temperature difference;
the temperature propagation detection circuit further comprises a second temperature sensor, the second temperature sensor having a second sensor element located at a second position remote to the first position and the second temperature sensor configured to provide a second temperature signal that is representative of a temperature at the second position;
the temperature protection circuit further comprises a third temperature sensor having a third sensor element located at a third position remote to the first position and the second position, the third temperature sensor configured to provide a third temperature signal that is representative of a temperature at the third position;
the temperature protection circuit is further configured to switch the electronic switch off, when a temperature difference between a temperature at the first position and a temperature at the third position rises above a second temperature threshold;

the temperature propagation detection circuit is configured to generate the temperature propagation signal dependent on a difference between the second temperature signal and the third temperature signal; and the temperature protection circuit is configured to decrease the first threshold when the difference between the second temperature signal and the third temperature signal increases and/or when the difference between the second temperature signal and the third temperature signal rises above a temperature difference threshold.

11. A method for driving an electronic switch integrated in a semiconductor body, the method comprising:

measuring a first temperature at a first position of the semiconductor body;

continuously detecting a temperature difference between two regions in the semiconductor body;

generating a temperature propagation signal based on continuously detecting the temperature difference;

switching off the electronic switch, when the temperature at the first position rises above a first threshold, wherein the first threshold is set dependent on the temperature propagation signal; and measuring a second temperature at a second position of the semiconductor body remote to the first position;

wherein the semiconductor body comprises a first active area in which the electronic switch is integrated;

the first position is within the first active area;

the second position is outside the first active area;

continuously detecting the temperature difference comprises evaluating a difference between the first temperature and the second temperature; and the first threshold is decreased when the difference between the first temperature and the second temperature increases and/or when the difference between the first temperature and the second temperature rises above a temperature difference threshold.

12. The method of claim 11, wherein continuously detecting the temperature difference comprises evaluating a difference between the first temperature and the second temperature.

13. The method of claim 11,
wherein the semiconductor body comprises a first active area in which the electronic switch is integrated,
wherein the first position is within the first active area, and
wherein the second position is outside the first active area.

14. The method of claim 11, further comprising:
measuring a third temperature at a third position remote to the first position and the second position; and switching off the electronic switch, when a temperature difference between the first temperature and the third temperature rises above a second temperature threshold.

15. The method of claim 14,
wherein the third position is outside the first active area and more distant to the first active area than the second position.

16. The method of claim 15, wherein the second temperature threshold is set dependent on the temperature propagation signal.

17. The method of claim 15, wherein continuously detecting the temperature difference comprises evaluating a difference between the second temperature and the third temperature.

18. The method of claim 11, wherein the electronic switch is a MOSFET.

19. A method for driving an electronic switch integrated in a semiconductor body, the method comprising:

measuring a first temperature at a first position of the semiconductor body;

continuously detecting a temperature difference between two regions in the semiconductor body;

generating a temperature propagation signal based on continuously detecting the temperature difference;

switching off the electronic switch, when the temperature at the first position rises above a first threshold, wherein the first threshold is set dependent on the temperature propagation signal;

measuring a second temperature at a second position of the semiconductor body remote to the first position;

measuring a third temperature at a third position remote to the first position and the second position; and switching off the electronic switch, when a temperature difference between the first temperature and the third temperature rises above a second temperature threshold;

wherein the semiconductor body comprises a first active area in which the electronic switch is integrated;

the first position is within the first active area;

the second position is outside the first active area;

the third position is outside the first active area and more distant to the first active area than the second position;

continuously detecting the temperature difference comprises evaluating a difference between the second temperature and the third temperature; and the first threshold is decreased when the difference between the second temperature and the third temperature increases and/or when the difference between the second temperature and the third temperature rises above a temperature difference threshold.

* * * * *